(12) United States Patent
Yeh et al.

(10) Patent No.: US 7,990,735 B2
(45) Date of Patent: Aug. 2, 2011

(54) ELECTRONIC DEVICE ENCLOSURE

(75) Inventors: Chin-Wen Yeh, Taipei Hsien (TW);
Zhi-Jian Peng, Shenzhen (CN);
Hai-Shan Sun, Shenzhen (CN)

(73) Assignees: Hong Fu Jin Precision Industry (Shen Zhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 128 days.

(21) Appl. No.: 12/482,906

(22) Filed: Jun. 11, 2009

(65) Prior Publication Data

US 2010/0165591 A1    Jul. 1, 2010

(30) Foreign Application Priority Data

Dec. 26, 2008  (CN) ................ 2008 2 0303728 U

(51) Int. Cl.
*H05K 7/14* (2006.01)
*H05K 7/18* (2006.01)

(52) U.S. Cl. ............... 361/801; 361/807; 361/810
(58) Field of Classification Search ......... 361/800–803, 361/807, 810, 730, 752, 755; 312/223.1, 312/223.2
See application file for complete search history.

(56) References Cited

U.S. PATENT DOCUMENTS

| | | | |
|---|---|---|---|
| 6,022,234 A * | 2/2000 | Shinoto et al. | 439/327 |
| 6,220,887 B1 * | 4/2001 | Downs | 439/377 |
| 6,970,363 B2 * | 11/2005 | Bassett et al. | 361/801 |
| 7,307,844 B2 * | 12/2007 | Wu | 361/719 |
| 7,489,523 B2 * | 2/2009 | Hsu | 361/801 |
| 7,660,114 B2 * | 2/2010 | Watanabe et al. | 361/690 |

\* cited by examiner

*Primary Examiner* — Hung S Bui
(74) *Attorney, Agent, or Firm* — D. Austin Bonderer

(57) ABSTRACT

An enclosure for an electronic device includes a chassis and a cover. The chassis includes a bottom wall and an opening. A circuit board is mounted on the bottom wall. The cover is mounted on the chassis to cover the opening of the chassis. A fixing apparatus is movably mounted on the cover. The fixing apparatus contacts and biases the expansion card toward the circuit board.

17 Claims, 3 Drawing Sheets

ELECTRONIC DEVICE ENCLOSURE

BACKGROUND

1. Technical Field

The present invention relates to an enclosure for an electronic device, and more particularly to an enclosure which can firmly accept an expansion card.

2. Description of Related Art

Increasing numbers of electronic devices utilize different expansion cards which are mounted therein. The expansion cards easily loosen in the enclosure especially when transported, which can impair proper function of the electronic device and even damage the device.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
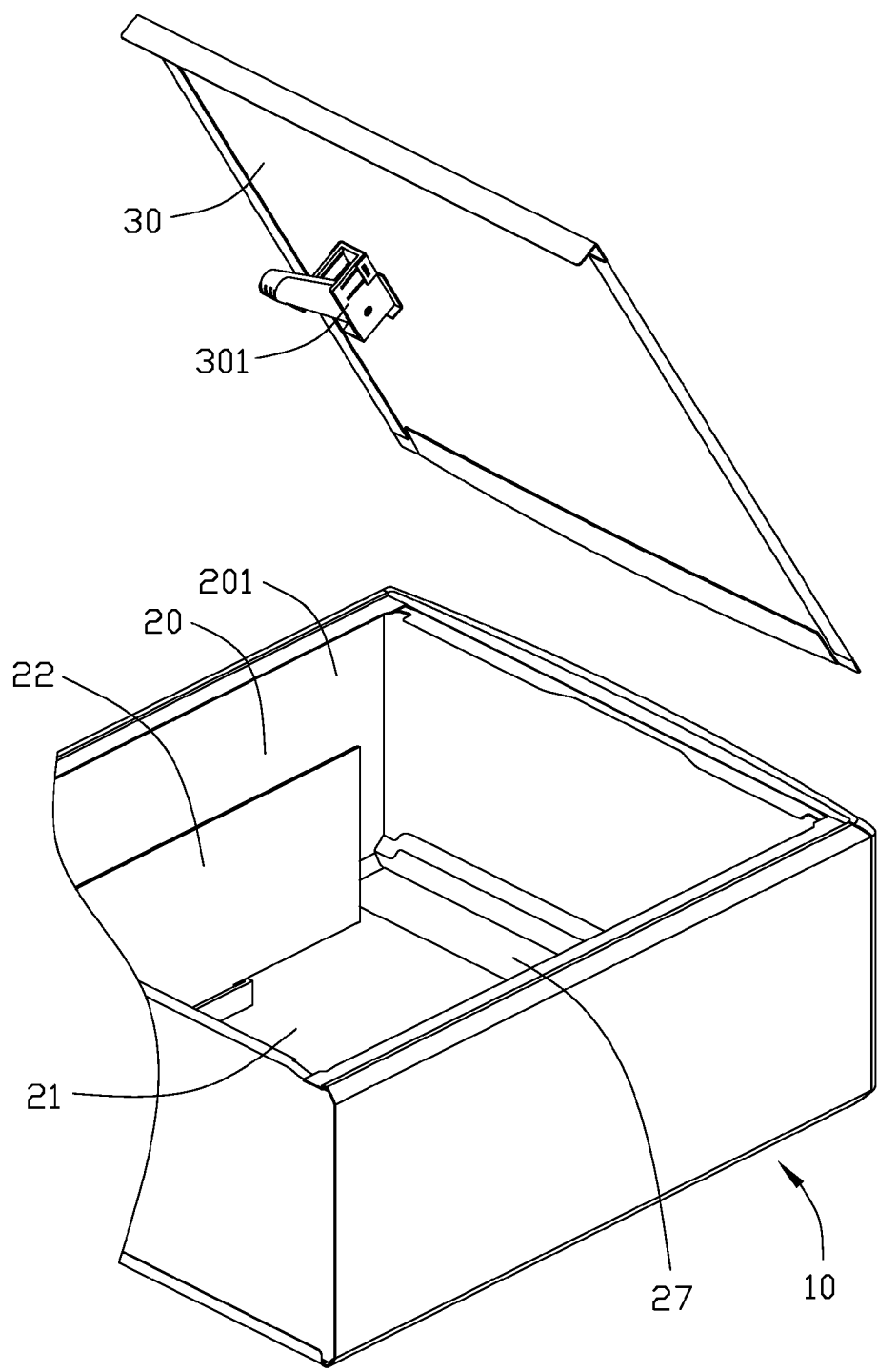
FIG. 1 is an isometric view of an enclosure for an electronic device in an open state.

Referring to FIG. 1, an enclosure for an electronic device 10 in accordance with an exemplary embodiment of the present invention is shown. The electronic device includes a chassis 20 and a cover 30. The chassis 20 includes a bottom wall 27 at a bottom portion thereof, and defines an opening 201 at a top portion thereof. A circuit board 21 is mounted on the bottom wall 27 of the chassis 20. An expansion card 22 is vertically received in a slot of the circuit board 21 to electrically connect the circuit board 21. The cover 30 is configured to be mounted on the chassis 20 to cover the opening 201 of the chassis 20.

Figure 2:
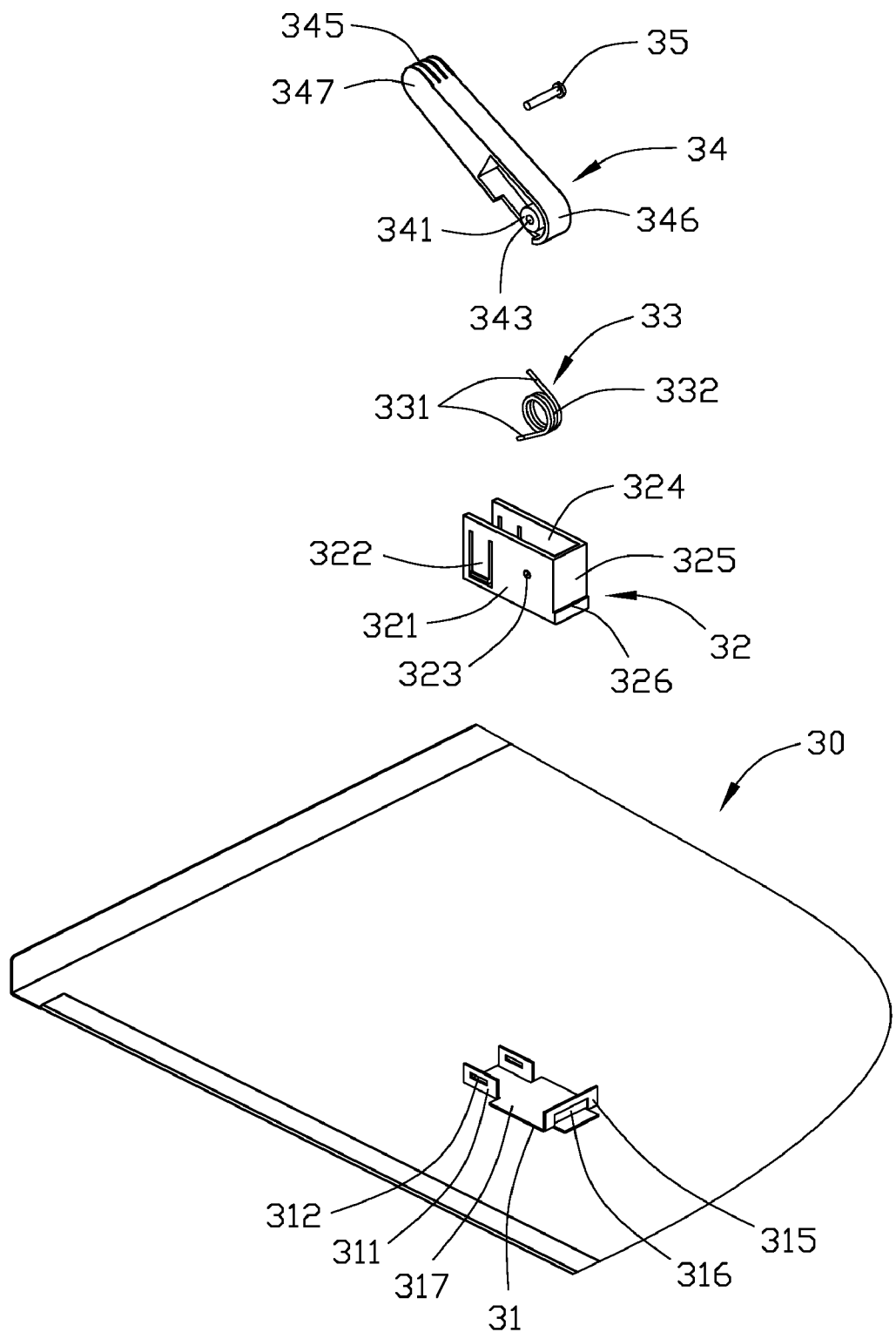
FIG. 2 is an isometric and exploded view of the fixing apparatus of FIG. 1.

Referring to FIGS. 1 and 2, the cover 30 has a fixing apparatus 301 mounted thereon. The fixing apparatus 301 includes a securing base 31, a receiving base 32, a torsional spring 33, a contact arm 34, and a pivot shaft 35.

The securing base 31 includes a securing piece 317 mounted on the cover 30. The two parallel edges of the securing piece 317 form a pair of first restricting pieces 311, each defining a first retaining hole 312 therein. Another edge of the securing piece 317 forms a second restricting piece 315. The second restricting piece 315 is perpendicular to the first restricting piece 311. A second retaining hole 316 is defined in the second restricting piece 315.

The receiving base 32 is configured to be mounted on the securing base 31. The receiving base 32 includes a pair of side panels 321 and a connection panel 325 connected between the pair of side panels 321. A receiving room 324 is defined among the pair of side panels 321 and the connecting panel 325. Each side panel 321 forms a clasp 322 corresponding to the first retaining hole 312 of the securing base 31. Aligned positions of the pair of side panels 321 define a pair of pivot holes 323 therein adapted for receiving the pivot shaft 35 rotating. The connection panel 325 forms a step portion 326 corresponding to the second retaining hole 316 of the securing base 31.

The contact arm 34 includes a first end 346 and a second end 347. A post 341 is formed on the first end 346. A fixing hole 343 is defined in the post 341, a diameter of which is slightly smaller than that of the pivot shaft 35. The second end 347 of the contact arm 34 is curved with anti-slip texturing 345 formed thereon.

The torsional spring 33 includes a coil 332 and a pair of ends 331. The coil 332 can be wrapped around the post 341.

During assembly of the fixing apparatus 301 to the cover 30, the receiving base 32 is received on the securing piece 317 of the securing base 31. The pair of side panels 321 of the receiving base 32 is restricted between the pair of first restricting pieces 311 of the securing base 31. The clasps 322 of the receiving base 32 are retained in the first retaining holes 312 of the securing base 31. The step portion 326 of the receiving base 32 is retained in the second retaining hole 316 of the securing base 31, such that receiving base 32 is mounted on the securing base 31.

The coil 332 of the torsional spring 33 is wrapped around the post 341 of the contact arm 34. One end 331 of the torsional spring 33 is in contact with the contact arm 34. The first end 346 of the contact arm 34 is then received in the receiving room 324 of the receiving base 32. The fixing hole 343 of the contact arm 34 is aligned with the pivot holes 323 of the receiving base 32. The other end 331 of the torsional spring 33 is in contact with the receiving base 32. The pivot shaft 35 is received in the pivot holes 323 and the fixing hole 343. The fixing hole 343 and the pivot shaft 35 have an interference fit. When the pivot shaft 35 rotates in the pivot holes 323, the contact arm 34 rotates accordingly.

Figure 3:
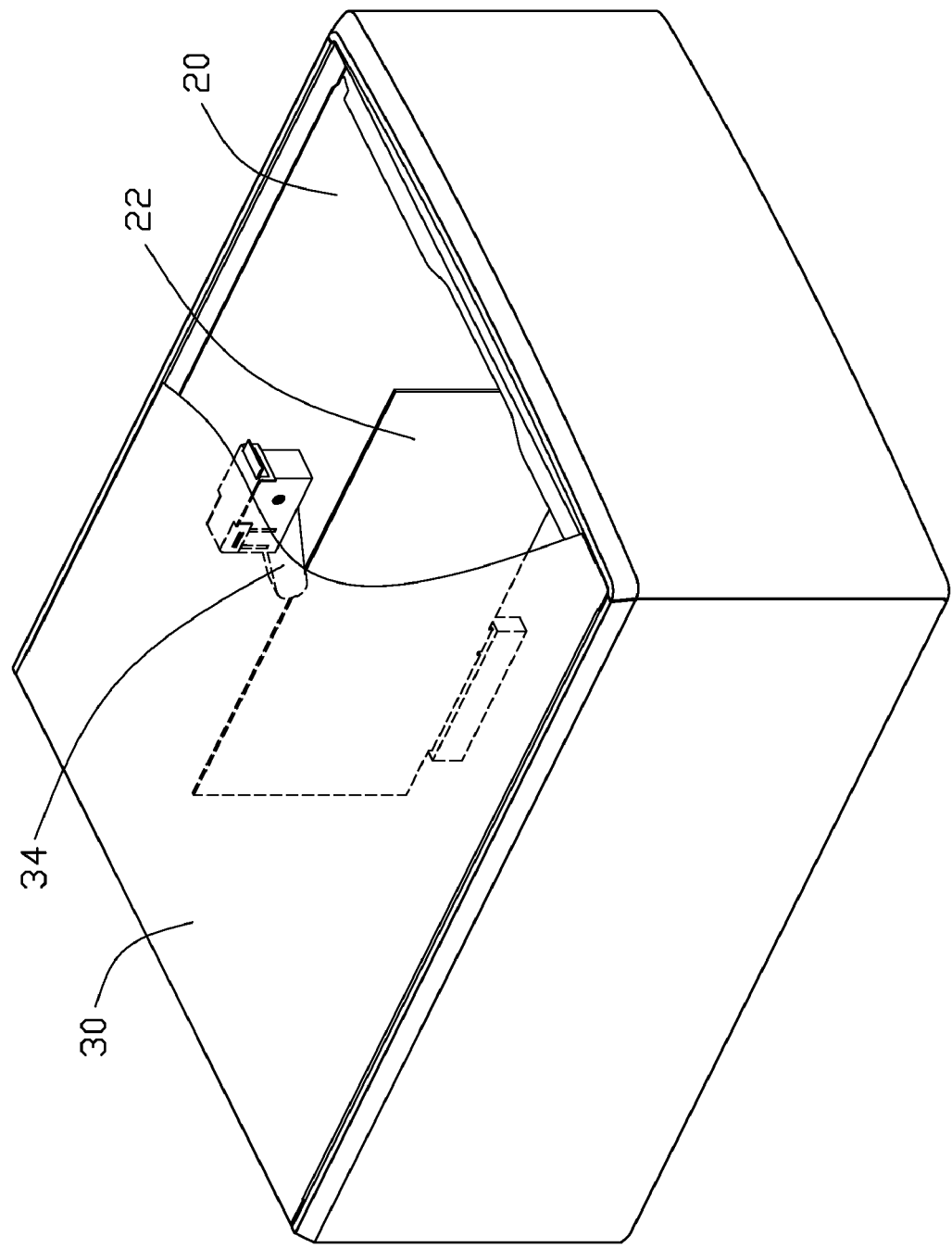
FIG. 3 is an isometric view of the electronic device enclosure of FIG. 1 in a closed state.

Referring to FIG. 3, after the cover 30 is mounted on the chassis 20, the opening 201 of the chassis 20 is covered. The contact arm 34 of the fixing apparatus 301 contacts a portion of the expansion card 22 and biases it toward the circuit board 21. Simultaneously, the torsional spring 33 is twisted by the rotation of the contact arm 34 with respect to the cover 30. A resilient force of the torsional spring 33 is exerted on the expansion card 22 via the contact arm 34. The anti-slip texturing 345 of the contact arm 34 contacts the top portion of the expansion card 20, restraining the contact arm 34 from sliding on the expansion card 22. The contact arm 34 thus securely fixes the expansion card 22, which remains snugly in the desired position.

In the above embodiment, the pivot shaft 35 can be designed to be firmly and immovably mounted in the pivot holes 323 of the receiving base 32, and movably received in the fixing hole 343 of the contact arm 34. Therefore, the contact arm 34 can rotate around the shaft 35 which is immovably mounted on the receiving base 32.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. An enclosure for an electronic device, comprising:
   a chassis comprising a bottom wall, the chassis defining an opening, a circuit board mounted on the bottom wall; and a cover movably mounted on the chassis for covering the opening thereof and a fixing apparatus movably mounted on the cover, the fixing apparatus comprising a contact arm comprising a first arm end pivotally mounted on the cover, and a second arm end configured for biasing; wherein the cover is movable with respect to the chassis between a first position and a second position; in the first position, the cover shields the opening to have the second arm end of the fixing apparatus contacting and biasing an expansion card toward the circuit board; in the second position, the cover is displaced from the opening to have the second arm end of the fixing apparatus separated from the expansion card.

2. The enclosure of claim 1, wherein anti-slip texturing is formed on the second arm end of the contact arm.

3. The enclosure of claim 1, wherein the fixing apparatus comprises a torsional spring compressed between the contact arm and the cover biasing the second arm end away from the cover.

4. The enclosure of claim 3, wherein the torsional spring comprises a coil, a first coil end and a second coil end, a post is formed on the first arm end of the contact arm, the coil is wrapped around the post, the first coil end of the torsional spring is in contact with the contact arm, and the second coil end of the torsional spring is in contact with the cover.

5. The enclosure of claim 1, wherein the fixing apparatus comprises a receiving base mounted on the cover; the receiving base comprises a pair of side panels, each having a pivot hole; the first arm end of the contact arm defines a fixing hole; a pivot shaft is received in the fixing hole, and received in the pivot holes, wherein the contact arm is capable of rotating.

6. The enclosure of claim 5, wherein each side panel forms a clasp; the fixing apparatus comprises a securing base fixed on the cover, the securing base comprises a pair of first restricting pieces, each defining a first retaining hole; the receiving base is restricted between the pair of first restricting pieces, and the clasps of the receiving base are retained in the first retaining holes of the securing base.

7. The enclosure of claim 6, wherein the receiving base comprises a connection piece connected between the pair of side panels, a step portion is formed on the connection piece; and a second retaining hole is defined in the securing base configured for engaging the step portion.

8. The enclosure of claim 5, wherein the pivot shaft is interferentially received in the fixing hole, and pivotally received in the pivot holes.

9. The enclosure of claim 5, wherein the pivot shaft is firmly secured in the pivot holes, and movably received in the fixing hole.

10. An enclosure for an electronic device, comprising:
a chassis comprising a bottom wall at a bottom side thereof and a cover mounted on a top side thereof facing the bottom wall, a circuit board mounted on the bottom wall; and
a fixing apparatus sandwiched between the cover and an expansion card capable of contacting and biasing the expansion card toward the circuit board, the fixing apparatus comprising a contact arm which comprises a first arm end pivotably mount on the cover, and a second arm end configured for biasing; the fixing apparatus further comprising a torsional spring compressed between the contact arm and the cover biasing the second arm end away from the cover.

11. The enclosure of claim 10, wherein anti-slip texturing is formed on the second arm end of the contact arm.

12. The enclosure of claim 10, wherein the torsional spring comprises a coil, a first coil end and a second coil end, a post is formed on the first arm end of the contact arm, the coil is wrapped around the post, the first coil end of the torsional spring is in contact with the contact arm, and the second end of the torsional spring is in contact with the cover.

13. The enclosure of claim 12, wherein the fixing apparatus comprises a receiving base mounted on the cover, the receiving base comprises a pair of side panels defining a pair of pivot holes; the first arm end of the contact arm defines a fixing hole; a pivot shaft is received into the fixing hole and received in the pair of pivot holes.

14. The enclosure of claim 13, wherein each side panel forms a clasp; the fixing apparatus comprises a securing base fixed on the cover, the securing base comprises a pair of first restricting pieces, each first restricting piece defines a first retaining hole; and the receiving base is restricted between the pair of first restricting pieces, and the clasps of the receiving base are retained in the first retaining holes of the securing base.

15. The enclosure of claim 14, wherein the receiving base comprises a connection piece connected between the pair of side panels, a step portion is formed on the connection piece; and a second retaining hole is defined in the securing base configured for engaging the step portion.

16. The enclosure of claim 13, wherein the pivot shaft is interferentially received in the fixing hole, and pivotally received in the pair of pivot holes.

17. The enclosure of claim 13, wherein the pivot shaft is firmly secured in the pair of pivot holes, and movably received in the fixing hole.

* * * * *